(12) United States Patent
Thompson et al.

(10) Patent No.: US 7,550,778 B2
(45) Date of Patent: Jun. 23, 2009

(54) SYSTEM AND METHOD FOR PROVIDING ACCESS TO AN ENCAPSULATED DEVICE

(75) Inventors: Douglas L. Thompson, Santa Barbara, CA (US); Gregory A. Carlson, Santa Barbara, CA (US); David M. Erlach, Santa Barbara, CA (US)

(73) Assignee: Innovative Micro Technology, Goleta, CA (US)

( * ) Notice: Subject to any disclaimer, the term of this patent is extended or adjusted under 35 U.S.C. 154(b) by 419 days.

(21) Appl. No.: 11/434,768

(22) Filed: May 17, 2006

(65) Prior Publication Data

US 2007/0269934 A1 Nov. 22, 2007

(51) Int. Cl.
   *H01L 29/207* (2006.01)
(52) U.S. Cl. .................. 257/99; 257/433; 257/E33.058; 257/E31.117; 257/E23.122; 257/E23.128
(58) Field of Classification Search .................. 257/99, 257/433; 438/456
   See application file for complete search history.

(56) References Cited

U.S. PATENT DOCUMENTS

| 6,686,225 | B2 | 2/2004 | Wachtler |
| 6,777,263 | B1 | 8/2004 | Gan et al. |
| 2002/0088988 | A1* | 7/2002 | Silverbrook .................. 257/99 |
| 2002/0089025 | A1* | 7/2002 | Chou .......................... 257/433 |
| 2003/0118277 | A1 | 6/2003 | Yu et al. |
| 2006/0138579 | A1* | 6/2006 | Shin et al. ................... 257/433 |

OTHER PUBLICATIONS

Van Zant, P. Microchip fabrication: a practical guide to semiconductor processing, 4th ed. New York, McGraw-Hill, 1000, ISBN 0071356363. pp. 62-63, 82-84, and 567.

* cited by examiner

*Primary Examiner*—David A Zarneke
(74) *Attorney, Agent, or Firm*—Jaquelin K. Spong

(57) ABSTRACT

A method for providing access to a feature on a device wafer, and located outside an encapsulation region is described. The method includes forming a cavity in the lid wafer, aligning the lid wafer with the device wafer so that the cavity is located substantially above the feature, and removing material substantially uniformly from the bottom surface of the lid wafer, until an aperture is formed at the cavity, over the feature on the device wafer. By removing material from the lid wafer in a substantially uniform manner, difficulties with the prior art procedure of saw cutting, such as alignment and debris generation, are avoided.

16 Claims, 6 Drawing Sheets

SYSTEM AND METHOD FOR PROVIDING ACCESS TO AN ENCAPSULATED DEVICE

CROSS REFERENCE TO RELATED APPLICATIONS

Not applicable.

STATEMENT REGARDING FEDERALLY SPONSORED RESEARCH

Not applicable.

STATEMENT REGARDING MICROFICHE APPENDIX

Not applicable.

BACKGROUND

This invention relates to integrated circuit and microelectromechanical systems (MEMS) manufacturing. More particularly, this invention relates to a system and method for accessing features of interest on an encapsulated device.

Microelectromechanical systems (MEMS) are very small moveable structures made on a substrate using lithographic processing techniques, such as those used to manufacture semiconductor devices. MEMS devices may be moveable actuators, sensors, valves, pistons, or switches, for example, with characteristic dimensions of a few microns to hundreds of microns. A moveable MEMS switch, for example, may be a cantilevered beam which connects one or more input terminals to one or more output terminals, all microfabricated on a substrate. The actuation means for the moveable cantilevered beam switch may be thermal, piezoelectric, electrostatic, or magnetic, for example.

Because the MEMS devices often have moveable components, such as the cantilevered beam, they typically require protection of the vulnerable moveable portions by sealing the devices fabricated on a device wafer with a protective cap or lid wafer, to form device wafer/lid wafer assembly containing a plurality of encapsulated MEMS devices. Furthermore, the MEMS devices may be intended to operate in a particular environment. For example, a MEMS switch handling high voltages may be required to operate in an electrically insulating environment, and thus the MEMS switch may be encapsulated with an electrically insulating gas. In order to prevent the preferred gas environment from leaking out over the lifetime of the switch, the environment may need to be sealed hermetically when the lid wafer and the device wafer are bonded into the wafer assembly.

Often, MEMS manufacturers prefer to ship whole wafer assemblies to customers before singulating the encapsulated die into the individual devices. Therefore, before dicing the MEMS wafer, it is often desirable to probe the MEMS wafer to test for functionality of the devices. This probing requires, in general, a set of pads coupled electrically to the encapsulated MEMS device, but located externally to the hermetic lid seal which encapsulates the device. Accordingly, access must be provided to those probe pads before the device wafer is diced.

FIG. 1 is a diagram of an exemplary encapsulated MEMS device 100 according to the prior art. The encapsulated MEMS device 100 may include a lid wafer 20 and a device wafer 30. At least one MEMS device 34 is fabricated on the device wafer 30. The fabrication methods for formation of the MEMS device 34 may include bulk machining or surface machining techniques, for example. At least one probe pad 32 is formed on the device wafer 30, and is coupled electrically to the MEMS device 34, although the circuitry which connects the probe pad 32 to the MEMS device 34 is not shown in FIG. 1. The probe pads 32 may be used to test the functionality of the MEMS device 34, before it is singulated. Because the probe pads 32 will be used for electrical access to the MEMS device 34, they are often made of a relatively soft metal, such as gold, and are therefore susceptible to damage.

The lid wafer 20 is attached to the device wafer 30 by an adhesive, to form a protective cap over the MEMS device 34. In order to allow the MEMS device 34 to move freely, a device cavity 24 may be formed in the lid wafer 20, by etching or other means of removing material, before it is adhered to the device wafer 30. Along with the device cavity 24, another cavity, the trench cavity 22, may be formed above the set of probe pads 32, to allow access to the probe pads by a probe device.

To provide access to the trench cavity 22 and underlying probe pads 32, the lid wafer 20 may be sawed above the trench cavity 22 by a narrow saw blade to remove the material 29 directly above the trench cavity 22 and probe pads 32. Typically, because the trench cavity is generally about 1 mm in width to allow access to the pads, and the saw blades are tens of microns wide, two saw cuts 28, shown in FIG. 1, may be required to remove the material 29 above the probe pads 32.

Several difficulties are associated with this prior art procedure. First, the saw blades may need to be carefully aligned with respect to the MEMS device, so that the saw cuts 28 are located directly above the trench cavity 22. This alignment is made more difficult because the trench cavity 22 cannot be seen directly from the top side of the wafer assembly. In addition, the saw cutting produces substantial debris, which may be flung by the saw blades over the probe pad 32 area. Furthermore, when the second saw cut is made, the lid remainder 29 is free from the surrounding material of the lid wafer 20. The lid remainder 29 therefore may fall down into the trench cavity 22 and into the vulnerable probe pad 32 area. This lid remainder 29 may prevent access to the probe pads 32, or short the probe pads 32, and interfere with the probing or the functioning of the MEMS device 34, and cause testing failures. Even if the presence of the lid remainder 29 on the probe pads 32 does not interfere with the functioning of the MEMS device 34, its presence may cause the parts to fail a visual inspection criterion. Such failures may negatively impact wafer yields in the most disadvantageous and costly point in the manufacturing process, after the device wafer is essentially complete.

Accordingly, a method is needed that provides access to the probe pads or other features of interest on the device wafer, while avoiding the difficulties associated with saw cutting of the lid wafer.

SUMMARY

Systems and methods are described here which eliminate the saw cutting steps in the fabrication of a MEMS device wafer, while still allowing for the testing or inspection of the MEMS devices. Instead of sawing through a region above a cavity, material is removed substantially uniformly across the back side of the lid wafer, until an aperture is formed over the cavity.

The systems and methods therefore include forming at least one feature on a device wafer, forming a first cavity in a front side, or top side, of a lid wafer, aligning the lid wafer and the device wafer so that the first cavity is located substantially above the feature, and removing material substantially uniformly across a back side, or bottom side of the lid wafer, until apertures are formed through the lid wafer above the feature.

In the embodiment described here, the lid wafer is first prepared with trench cavities and device cavities formed therein, and at least one MEMS device and probe pad are formed on a device wafer. The lid wafer is then aligned with the device wafer so that the trench cavity is substantially above the probe pad, and the lid wafer is adhered to the device wafer with an adhesive. Then, instead of sawing the lid wafer at this point, a grinding process is used which removes material substantially uniformly across the back side of the wafer. The grinding process may remove material from the back side of the wafer to a depth at which apertures are opened above the trench cavities formed in the wafer, thus providing access to the set of probe pads below.

Because the lid wafer is background rather than saw cut, there are essentially no alignment requirements for the process. Furthermore, debris associated with the saw cutting, especially the lid remainder material described above, is eliminated. This may result in higher wafer yields for the manufacturer. In addition, the process may be simpler, requiring only the mounting of the wafer assembly onto the grinding apparatus, and grinding for several minutes until the desired depth is reached. This may result in a savings in manufacturing time and reduced cost for the completed MEMS wafer assembly.

These and other features and advantages are described in, or are apparent from, the following detailed description.

BRIEF DESCRIPTION OF THE DRAWINGS

Various exemplary details are described with reference to the following figures, wherein.

DETAILED DESCRIPTION

The systems and methods described herein may be particularly applicable to encapsulated microelectromechanical devices, however, they may also be applicable to any integrated circuit formed on a device wafer and encapsulated with a lid wafer.

Figure 2:
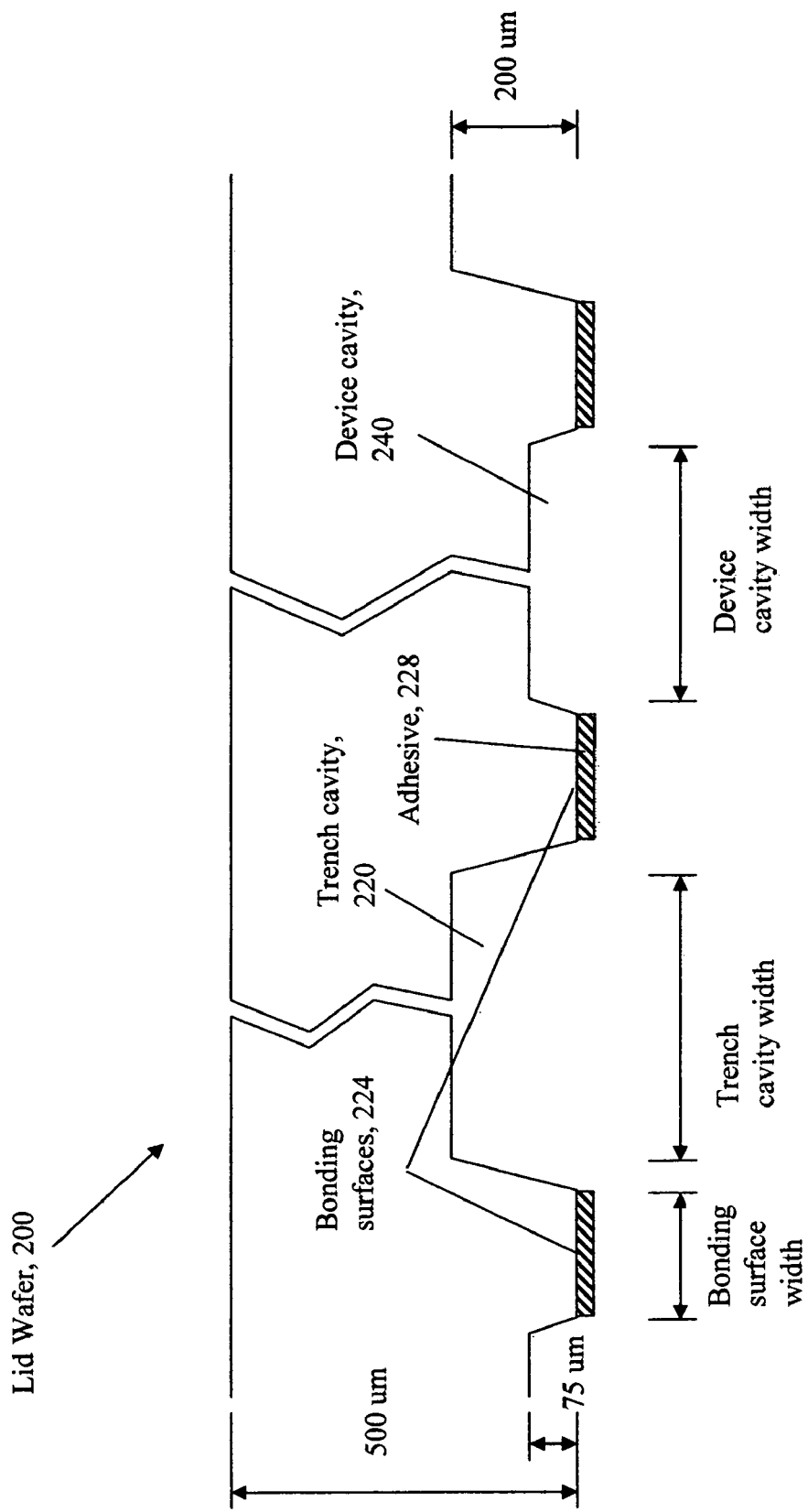
FIG. 2 is a cross sectional view of an exemplary lid wafer after formation of a trench cavity and a device cavity.

FIG. 2 is a diagram of an exemplary lid wafer 200 with a first cavity, a trench cavity 220 and a second cavity, a device cavity 240 formed therein, which may be used to form the encapsulated MEMS device described herein. The trench cavity 220 will be placed directly above the probe pads, and the device cavity 240 directly above the MEMS device, when the lid wafer is combined with the device wafer to form the encapsulated MEMS device. The trench cavity 220 and device cavity 240 may be formed in a front side, or top side, of the lid wafer using a dry etch process, such as deep reactive ion etching (DRIE). However, the trench cavity 220 and device cavity 240 may also be formed using a cheaper, wet process such as a chemical etch. For example, the lid wafer 200 may first be covered with a suitable etch mask, in this example silicon nitride, and patterned to expose the portions of the lid wafer 200 which will be removed to form the trench cavity 220. The patterned wafer may then be submerged in a chemical etchant, such as a potassium hydroxide (KOH) solution, which etches the silicon at a rate of about 1 μm per minute. The chemical etching may be anisotropic, etching the 111 planes more slowly than the other planes. As a result, the wet etching technique may form the trench cavity 220 in the lid wafer with a wall slope of about 54.7 degrees, that is, the angle defined by the sidewall and a line parallel to the plane of the wafer is about 54.7 degrees. Accordingly, the width of the trench cavity may be substantially wider at their mouths than at its base. The base width of the trench cavity may be, for example, about 1000 μm. The width of the trench cavity may be sufficient to allow easy access by a probe tool to the probe pads which will be formed on the device wafer.

The chemical etch of the trench cavity 220 in the KOH solution may be allowed to proceed until the trench cavity 220 has reached it full depth of about 200 μm. After etching the trench cavity 220, the lid wafer 200 may again be covered with a suitable etch hard mask, and patterned according to the locations and widths of the device cavity 240. The hard mask may be patterned, and the lid wafer again submerged in the KOH solution to etch the device cavity to a depth of about 75 μm. The base width of the device cavity may be, for example, about 4000 μm. The width of the device cavity may be sufficient to allow an adequate perimeter around the MEMS device and room for its movement, while still minimizing the wafer area lost to such overhead.

In an alternative embodiment, the trench cavity 220 may first be etched to an intermediate depth of, for example, about 125 μm. The etch hard mask with the pattern of the trench cavity partially formed therein may then be patterned in the areas corresponding to the device cavity 240. The 75 μm deep device cavity 240 may then be etched along with the remainder of the 200 μm deep trench cavity 220, completing the two cavities simultaneously in the lid wafer.

Accordingly, upon completing the chemical etch step, the depth of the trench cavity may be at least about 150 μm deep, and more preferably about 200 μm deep. The depth of the device cavity may be at least about 50 μm deep and more preferably about 75 μm deep. These depths may be chosen based on a multitude of criteria which may include device clearance or electrical requirements, packaging strength or atmosphere requirements or simply as a tradeoff between processing time in the chemical bath and allowing sufficient depth to accommodate the tolerances in the material removal process, described below. For example, if the grinding process is only controlled to +/−25 μm, the trench cavity needs to be sufficiently deep to assure that the grinding at the shallow extreme of the tolerance range still is sufficient to open an aperture at the base of the trench cavity. Furthermore, as in this example, because the grinding process removes the base portion of the trench cavity, as well as a portion of the sloping side wall formed by the anisotropic etch, the final aperture size will depend somewhat on the depth of the trench cavity. A trench cavity depth of about 200 μm is generally sufficient for these purposes.

An adhesive 228 may also be applied to the bonding surfaces 224 of the lid wafer 200. The bonding surfaces 224 may be the unetched portions of the lid wafer which will be bonded to the device wafer. Adhesive may not be required for certain types of bonds, like anodic bonding. However, in this example, the adhesive may be any of a glue, epoxy, glass frit, cement, metal or metal alloy, depending on the type of bond desired, the temperature range which the bond must withstand, and whether the bond is required to be hermetic. The thickness of the adhesive may depend on the application, but may be, for example, about 20 µm thick. The width of the bonding adhesive may be approximately the same as the width of the bonding surfaces, or about 400 µm. In one exemplary embodiment, the bonding surface may also include rigid protrusions, or standoffs, which define a minimum separation between the lid wafer 20 and the device wafer 30, when the wafers are pressed against one another. In another exemplary embodiment, the adhesive is glass frit with embedded particles, as described in co-pending U.S. patent application Ser. No. 11/390,085, incorporated by reference herein in its entirety. In this embodiment, the diameter of the rigid embedded particles defines the separation between the lid wafer 20 and the device wafer 30, rather than protrusions in the lid wafer bonding surface 224. Accordingly, the thickness of the adhesive may be about 15 µm thick, the thickness of the diameter of the embedded sapphire spheres, and about 400 µm wide. In yet another exemplary embodiment, the lid wafer 200 may be joined to the device wafer 300 by anodic bonding.

It should be understood that the embodiment shown in FIG. 2 is exemplary only, and that other embodiments may be envisioned which do not have a device cavity. In such embodiments, clearance for the MEMS devices may be provided by forming or depositing a mechanical standoff on the bonding surfaces 224 of the lid wafer 20, or by using particles embedded in an adhesive as the standoffs as described in the incorporated '085 application, for example. In these embodiments, the clearance for the MEMS devices may be provided by the standoffs on the lid wafer 20, rather than by a device cavity 240 in the lid wafer 200.

The material of the lid wafer may be, for example, any of amorphous silicon, crystalline silicon, glass, quartz, ceramic, or sapphire, for example. Metal substrates may also be used, such as Kovar, a nickel-iron-cobalt alloy or Invar, a 36/64 alloy of nickel and iron. Kovar and Invar have a coefficient of thermal expansion closely matching that of silicon, which may be the preferred substrate for the device wafer. In particular, materials that do not slice readily may be used for the lid wafer, as a saw blade may not be used to expose the probe pads. If the lid material is a moldable Invar or glass, for example, the trench cavity 220 and device cavity 240 may be formed by molding the features when the lid wafer is molded. The lid wafer may be, for example, 500 µm thick.

Figure 3:
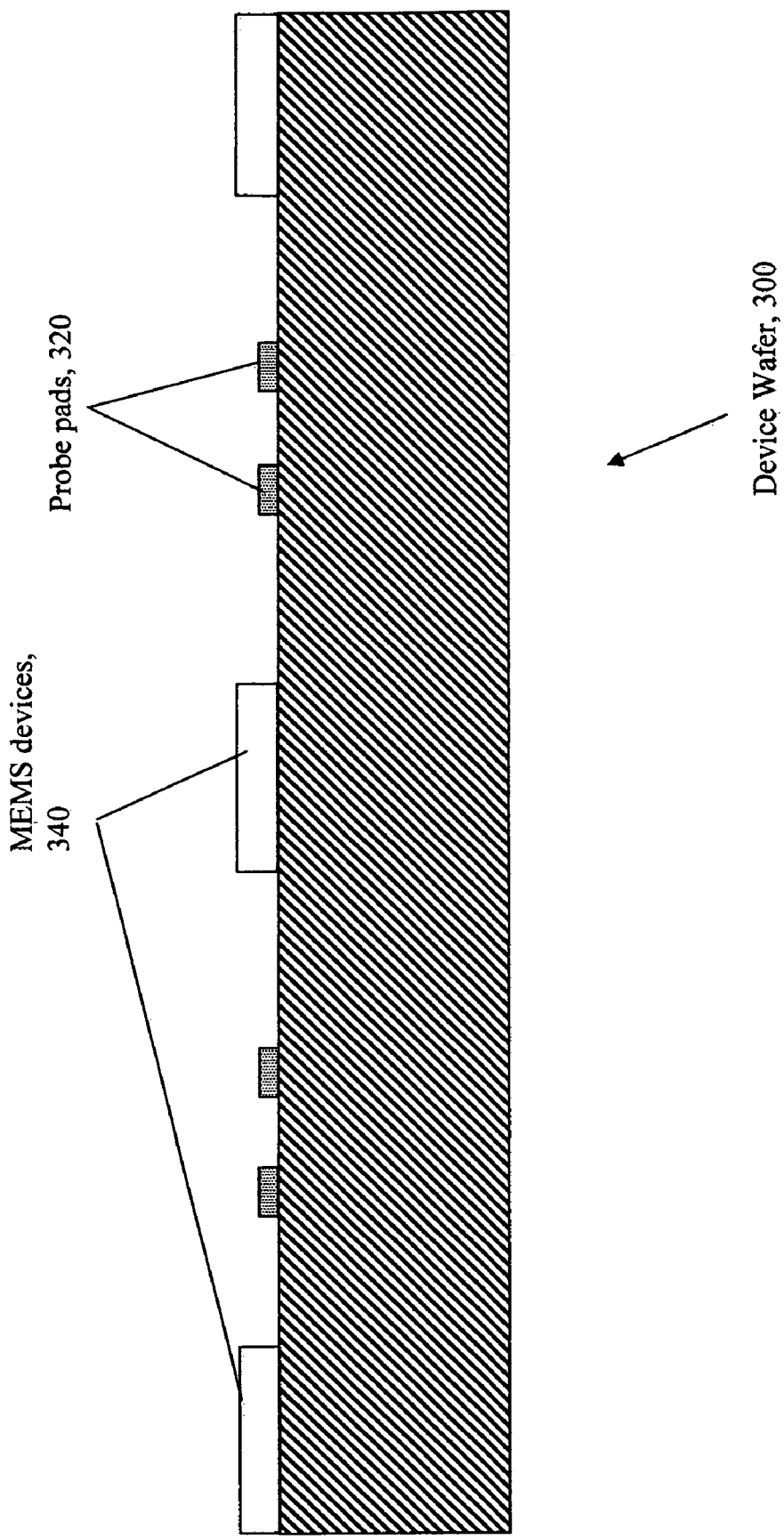
FIG. 3 is a cross sectional view of an exemplary device wafer after after formation of the MEMS devices and probe pads.

FIG. 3 is a diagram showing the features formed in a device wafer 300. It should be understood that the device wafer 300 may be composed of any number of satisfactory substrate materials, such as silicon, gallium arsenide, silicon-on-insulator (SOI), glass, sapphire, and the like. In one embodiment, the device wafer 300 is silicon, 675 µm thick, and the MEMS device 340 is a cantilevered thermal switch, such as that described in U.S. application Ser. No. 11/263,912, incorporated by reference herein in its entirety. A plurality of like MEMS devices 340 may be formed on the surface of the device wafer 300, using, for example, surface machining processes. It should be understood that the MEMS devices 340 may be any of a number of devices other than the switch described in the incorporated '912 application, such as accelerometers, sensors, actuators, and the like. For example, a cantilevered MEMS device may be fabricated by first plating a sacrificial copper layer, then plating a cantilevered nickel beam over the sacrificial copper layer. Finally, after removing the sacrificial copper layer, the nickel beam is free to bend about its anchor point. Since the details of the MEMS devices 340 are not necessary to the understanding of the systems and methods described here, they are depicted only schematically in FIGS. 3-5. Details as to the fabrication of a thermal switch as the MEMS devices 340 are set forth in the incorporated '912 application.

However, because the MEMS devices 340 generally employ a movable component, clearance must be provided in the lid wafer 200 for the movement of the MEMS devices 340. The device cavity 240, shown in FIG. 2, provides this clearance in the lid wafer. The amount of clearance required may depend on the design of the MEMS devices 340, their total height and tolerances associated with this height and the movement of the MEMS devices 340.

Probe pads 320 are also formed on the surface of the device wafer 300. The probe pads may be formed by, for example, electroplating a film of gold about 7 µm thick, 80 µm wide and 220 µm long. However, any other conductor having any other shape suitable for the application and deposited by any other means may also be used as the probe pads. These probe pads 320 may be connected electrically to the MEMS devices 340, and offer a way to test for functionality of the MEMS devices 340. For example, the resistance between a set of probe pads 320 may be checked to verify electrical continuity of the device, and appropriate resistance values. A resistance reading too high or too low may indicate an inoperable or nonfunctional device.

The electrical connection between the probe pads and the MEMS devices may take the form of conductors deposited on the surface of the device wafer 300, or of conductors embedded in an interconnect structure. A description of an interconnect design which can be used in conjunction with the systems and methods described herein, is described in U.S. patent application Ser. No. 11/211,625, which is hereby incorporated by reference in its entirety. However, since techniques for coupling a MEMS device to an external access pad are known in the art, they are not described in further detail here, nor are they illustrated in the accompanying drawings. In any case, it may be required that the lid wafer 200 be sealed to the device wafer 300, despite the presence of any electrical conductors.

Figure 4:
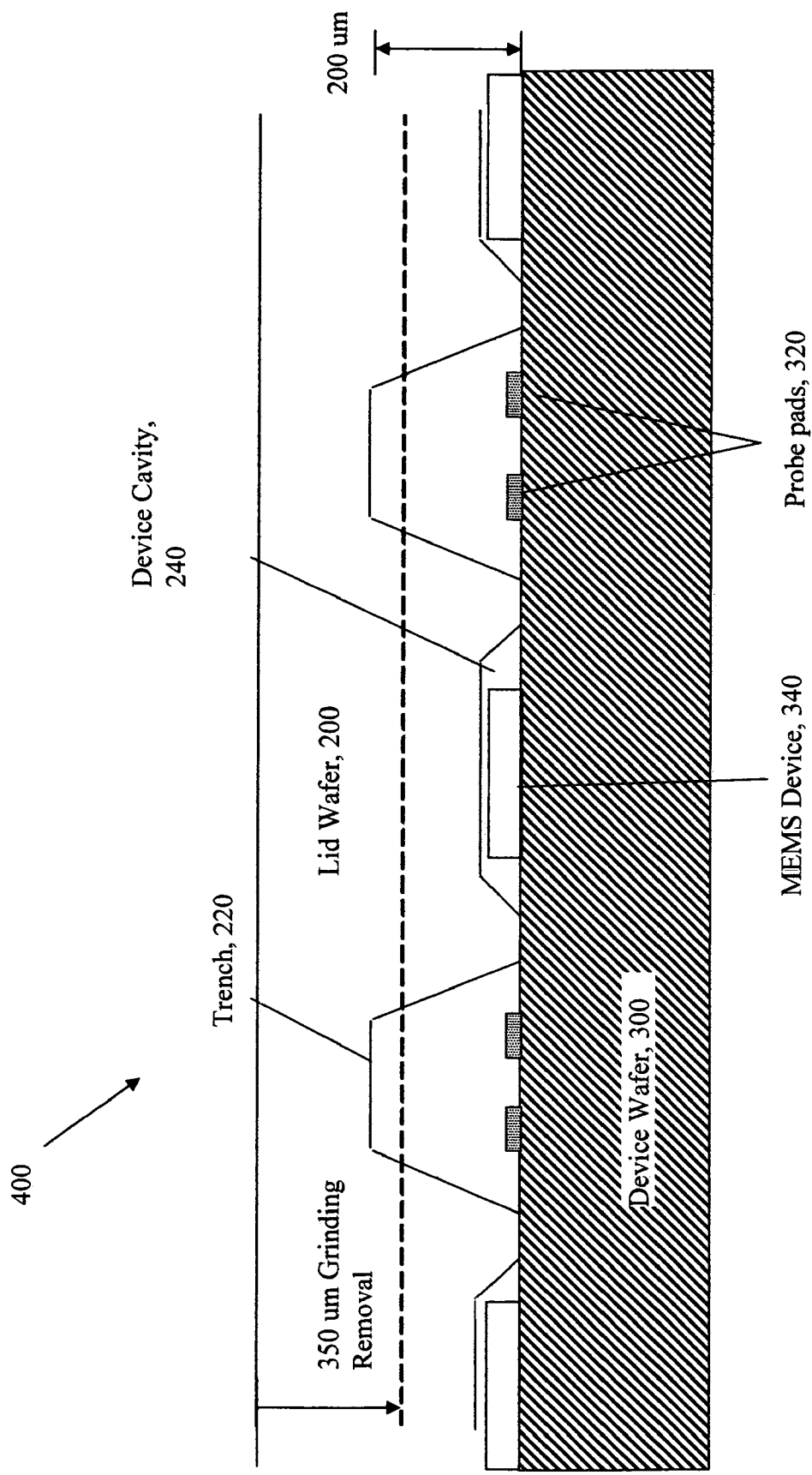
FIG. 4 is a cross sectional view of an exemplary wafer assembly and the grinding process.

After completion of the lid wafer 200 and the device wafer 300, the lid wafer 200 is aligned with the device wafer 300 and clamped together to form a wafer assembly 400 as shown in FIG. 4. The wafer assembly 400 may then be loaded into a wafer bonding tool, which may apply heat and pressure to the wafer assembly to cure the adhesive 228. In the case of the glass frit adhesive, the wafer assembly is heated to a temperature of about 400 degrees centigrade to 450 degrees centigrade for at least about 10 minutes, to melt the glass frit and form the seal. After curing the adhesive, the wafer assembly 400 is essentially complete, and ready for testing or dicing. It may be more cost effective to test the devices before dicing or singulating, to avoid investing additional time and money in a wafer which is defective. Furthermore, MEMS manufacturers often prefer to ship whole wafers to their customers, to avoid customer-specific packaging procedures. It is advantageous for the MEMS manufacturers to know which of the MEMS devices 340 are functional before shipment, so that maps showing known good die are provided to the packaging house and wafers with non-functional devices are not shipped to customers inadvertently. Finally, testing of the MEMS devices 340 is required to give the wafer manufacturers knowledge of the success and effectiveness of their manufacturing procedures.

Because the various MEMS manufacturers, as well as their customers, may prefer to test the MEMS devices 340 before singulating, electrical access pads 320 may be provided which are electrically coupled to the MEMS devices 340. Since it is desired to probe the MEMS devices 340 via the access pads 320 before the MEMS devices 340 have been singulated, an aperture may need to be provided through the lid wafer to allow passage of the probe tools to the probe pads 320. Such an aperture may be created by removing material substantially uniformly across the back side of the lid wafer to a level beyond the depth of the trench cavity formed in the front side. It should be understood that the terms "front side" and "top side" refer to one flat side of the lid wafer, and the terms "back side" or "bottom side" refer to another flat side of the lid wafer, opposite the front side or top side. Processes which can be used to remove the material from the back side of the lid wafer are, for example, grinding, lapping, chemical mechanical polishing (CMP), wet etching, dry etching and ion milling. A grinding process used to form the apertures is shown in FIG. 4.

Using the grinding process, for example, material is removed substantially uniformly across the back side of the lid wafer, by applying an abrasive on a grinding wheel against the back side of the lid wafer. For this reason, there are no critical alignment tolerances of the wafer assembly on the grinding wheel. This is in contrast to the prior art procedure, wherein the saw blade must be carefully aligned relative to the MEMS device 100, so as to saw only in the appropriate location above the trench cavity 22.

As mentioned above, one embodiment of the systems and methods uses a grinding process to remove material substantially uniformly across the back side of the lid wafer. The grinding may be accomplished by using a grinder, such as that available from Okamoto, Inc. of Japan. The grinder may use a diamond impregnated media as the abrasive. The grinding may take place in two portions: a first, rough portion removing a relatively large amount of material but leaving a relatively rough surface, followed by a second, slower portion removing a smaller amount of material but leaving a smoother surface.

The rotation rate of the grinding wheel for both portions may be about 1600 rpm, and the rotation rate of the table holding the wafer assembly 400 may be about 80 rpm. Using these parameters, the grinding tool may be programmed to remove material at a rate of about 60 $\mu$m per minute for about 5.5 minutes for the first rough portion, to remove 330 $\mu$m of material. The grinding tool may then be set at 20 $\mu$m per minute for the fine grinding portion. The second portion may last for about one minute, to remove the last 20 $\mu$m of material. Therefore, in total, 350 $\mu$m of material shown in FIG. 4 may be removed in about 6.5 minutes.

The removal of material may either be timed as described above, or may be monitored by removing the wafer assembly intermittently and inspecting the wafer assembly visually to determine if the grinding has reached a sufficient depth that an acceptable aperture has been formed above the probe pads.

Alternatively, a two-step grinding process may be used to remove the material uniformly from the back side of the lid wafer 200. The two-step process may include, for example, a first rough grinding step which may be performed to remove, for example, the first 330 $\mu$m of the lid wafer material, followed by a second fine grinding step to remove, for example, the final 20 $\mu$m of material. Each of the grinding steps may use different grinding parameters and a different abrasive pad. The rough grinding step may be performed with diamond grit 320, wheel rotation rate of about 1400 rpm and table rotation rate of about 60 rpm, for example. Material may be removed at a rate of about 150 $\mu$m per minute, so that this step lasts for 2.2 minutes. The rough grinding step may be followed by the fine grinding step with diamond grit 2000 pad, a grinding wheel rpm of about 1600 and a table rotation rate of about 80 rpm. Under these conditions, material may be removed at a rate of 20 $\mu$m per minute, so that performing this step for an additional minute removes the final 20 $\mu$m of material. In this case, as in the first embodiment, the total amount of material removed from the lid wafer may be, for example, about 350 $\mu$m. The two-step process may require less overall processing time, because the rough grinding step removes the material more quickly than the single step process described previously. However, it has the disadvantage that two grinding wheels may need to be used.

In addition to grinding, lapping of the lid wafer with an abrasive slurry may be used in addition to, the grinding process. For example, in a two-step process using both grinding and lapping, the first step is a rough grinding step, similar to the rough grinding step described above. In particular, the rough grinding step may use a diamond grit 320 pad, with the grinding wheel rotating at 1400 rpm and the table rotating at 60 rpm. This step is performed for 2.2 minutes at 150 $\mu$M per minute to remove 330 $\mu$m of material from the back side of the lid wafer. The rough grinding step may be followed by a fine lapping step, using a double or single sided lapping machine, a table rotation rate of 30 rpm, an abrasive slurry, such as diamond, alumina or silica particulate slurries, with a pressure between the lapping tool and the wafer assembly of about 60 lbs. Under these circumstances, the lapping step may remove material at a rate of up to 2 $\mu$m per minute, and last for a duration of about one to five minutes to achieve an excellent surface finish.

Figure 1:
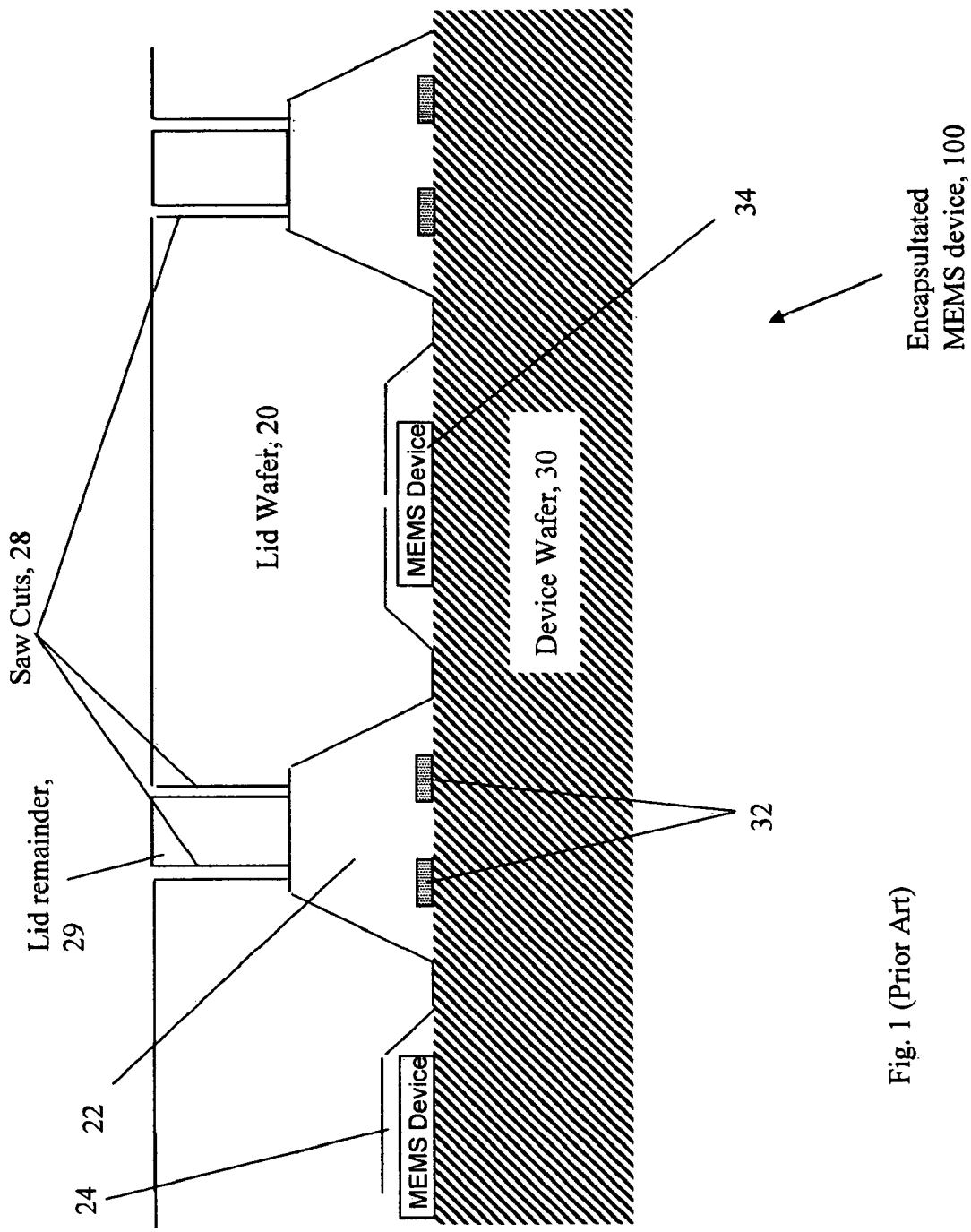
FIG. 1 is a cross sectional view showing a prior art method for providing access through a lid wafer to a device wafer.

The nominal amount of material removed from the lid wafer by any of the aforementioned grinding processes may be at least about 300 $\mu$m, and more preferably about 350 $\mu$m. The tolerance associated with the grinding process may be about +/−25 $\mu$m across the width of a six inch wafer. Accordingly, the nominal thickness of the remaining lid wafer is about 150 $\mu$m, although in some areas, the lid wafer may be as thin as about 125 $\mu$m and in other areas as thick as about 175 $\mu$m. The tolerance requirements only need only to assure that a sufficient thickness of lid material remains to provide an uncompromised seal over the MEMS device 340. This tolerance is relatively easy to achieve in a manufacturing situation, particularly when compared to the difficulty of locating the saw blades accurately in the saw cutting procedure of the prior art, as illustrated in FIG. 1.

Figure 5:
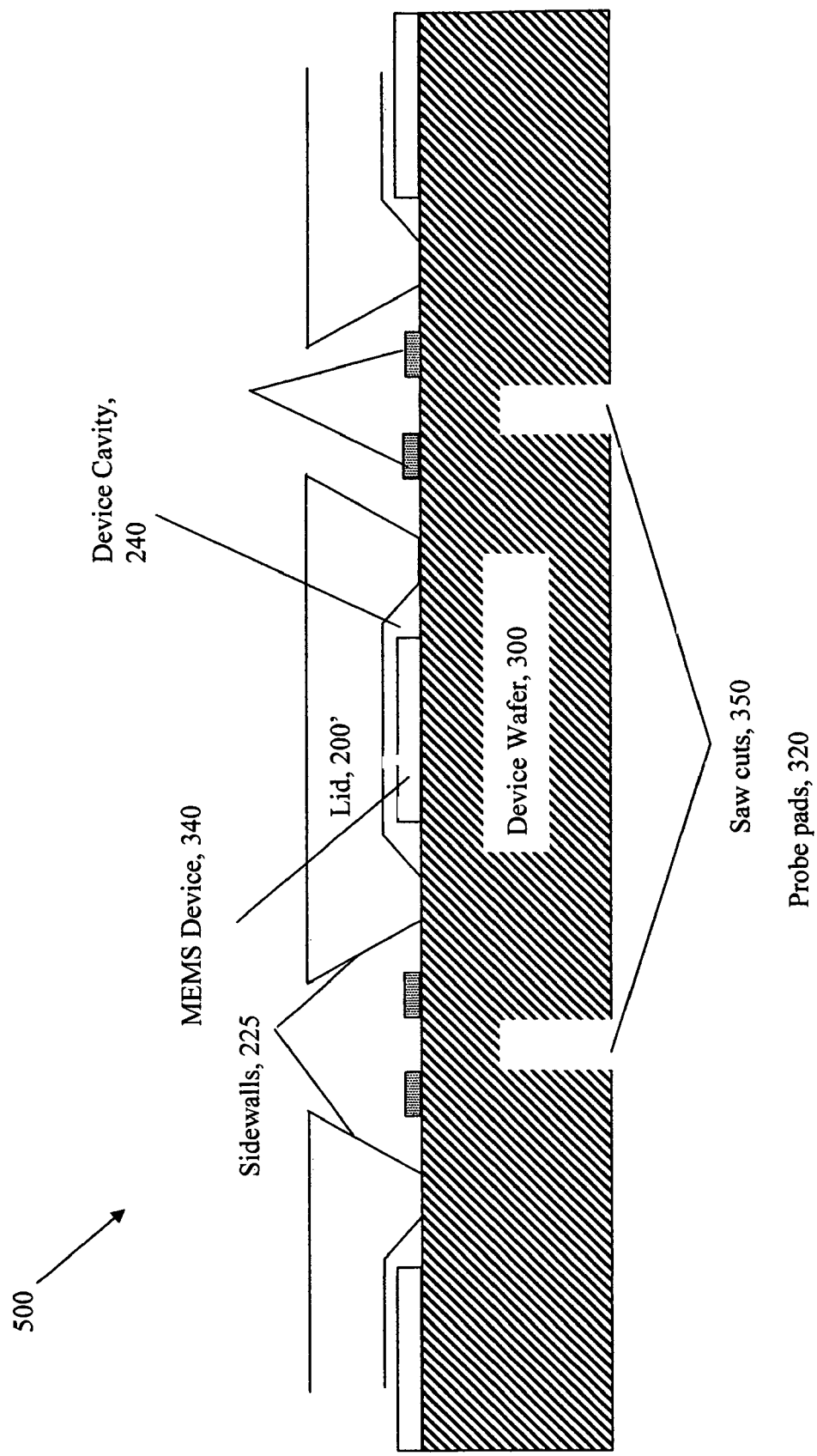
FIG. 5 is a cross sectional view of the encapsulated MEMS device after completion of the grinding process.

FIG. 5 is a cross sectional view of the encapsulated MEMS device 500 after completion of the grinding process. In particular, FIG. 5 is shows the encapsulated MEMS device 500 after the removal of 350 $\mu$m of material from the back side of the lid wafer. As can be seen in FIG. 5, apertures are formed through the lid wafer, at the location of the trench cavities above the probe pads 320 on the device wafer 300. The apertures are formed when the removal of material proceeds to a depth exceeding the end wall of the trench cavities. The apertures then form a plurality of separate lids 200' covering the individual MEMS devices 340. According to the design described here, the grinding proceeds to a depth of about 50 $\mu$m beyond the end wall of the trench cavity, as was shown in FIG. 4. At this point, the material of the lid wafer has been completely removed above the probe pads 320, to provide the access area and form individual lids 200'.

The individual MEMS devices 340 may then be tested for functionality using probe pads 320. A probe device may be connected to probe pads 320 and the resistance or electrical continuity of the device may be measured. Resistance measurements outside a range of anticipated values may indicate a damaged or non-functional device. A decision may then be made, whether to process the wafer further, whether to undertake some rework operations, or whether to scrap the wafer entirely.

After testing for functionality with the probe pads 320, the MEMS devices 340 may be diced or singulated, as usual. For example, the functional MEMS devices 340 may be separated from the device wafer 300 with saw cuts 350 between the probe pads, as shown in FIG. 5. Procedures for saw cutting a device wafer 300 to singulate the individual dies are known in the art. Because the MEMS devices 340 have already been encapsulated and tested, they are, at this point in the process, relatively impervious to debris generated by the saw cutting. The encapsulated MEMS devices 340 are then ready for further packaging, shipping or integration with other devices or products.

As can be seen in FIG. 5, the encapsulated MEMS device 500 manufactured according to the process described herein, differs structurally in substantial ways from the encapsulated MEMS device 100 of the prior art shown in FIG. 1. For example, encapsulated MEMS device 500 may have lid wafer sidewalls 225 on the outside of the encapsulating device cavity 240, that run from the top surface of the lid wafer to the bonding surface of the lid wafer. These sidewalls in the encapsulated MEMS device 500 may reflect the trench creation process, rather than the saw cut process. As a result, the sidewalls may, in general, be non-vertical over substantially their entire length. For example, the slope of the side walls 225 on the aperture formed by the grinding process may have a slope of about 55 degrees, and more particularly about 54.7 degrees, reflecting their creation by the anisotropic wet etch. In contrast, the slope of the sidewalls of the device 100 of the prior art may have a substantially vertical orientation, at least over a portion of the sidewall length, because this portion of the sidewall was formed by the vertical saw blades.

The thickness of the lids 200' remaining adhered to the device wafer 300 may also be thinner than that of the lid wafer 20 remaining on the device wafer 30 in FIG. 1. Because of the removal of 350 µm of material from the lid wafer as described previously, only about 150 µm of lid wafer material remains with the encapsulated MEMS device 500. As a result, the overall height of the encapsulated MEMS device 500 using the systems and methods described here may be only about 675+150=825 µm, whereas the overall height of the encapsulated MEMS device 100 using the same thickness substrates may be 675+500=1175 µm. Therefore, the systems and methods disclosed here may be capable of generating an encapsulated MEMS device 500 whose overall height is thinner than that generated by the prior art saw cut method. This may be particularly advantageous in applications wherein the overall form factor of the device needs to be minimized.

The thickness of the area of lid 200' substantially above the MEMS device 340 is, in general, substantially less than about 400 µm, but preferably between about 75 µm and about 100 µm. If a thicker lid 200' is desired over the MEMS device 340, a thicker lid wafer substrate may be used. For example, increasing the lid substrate thickness to 675 µm from 500 µm may increase the thickness of the lid wafer remaining directly over the MEMS device 340 to 250 µm from 75 µm. This may help prevent breakage of the encapsulation or leaking of the hermetic seal.

Figure 6:
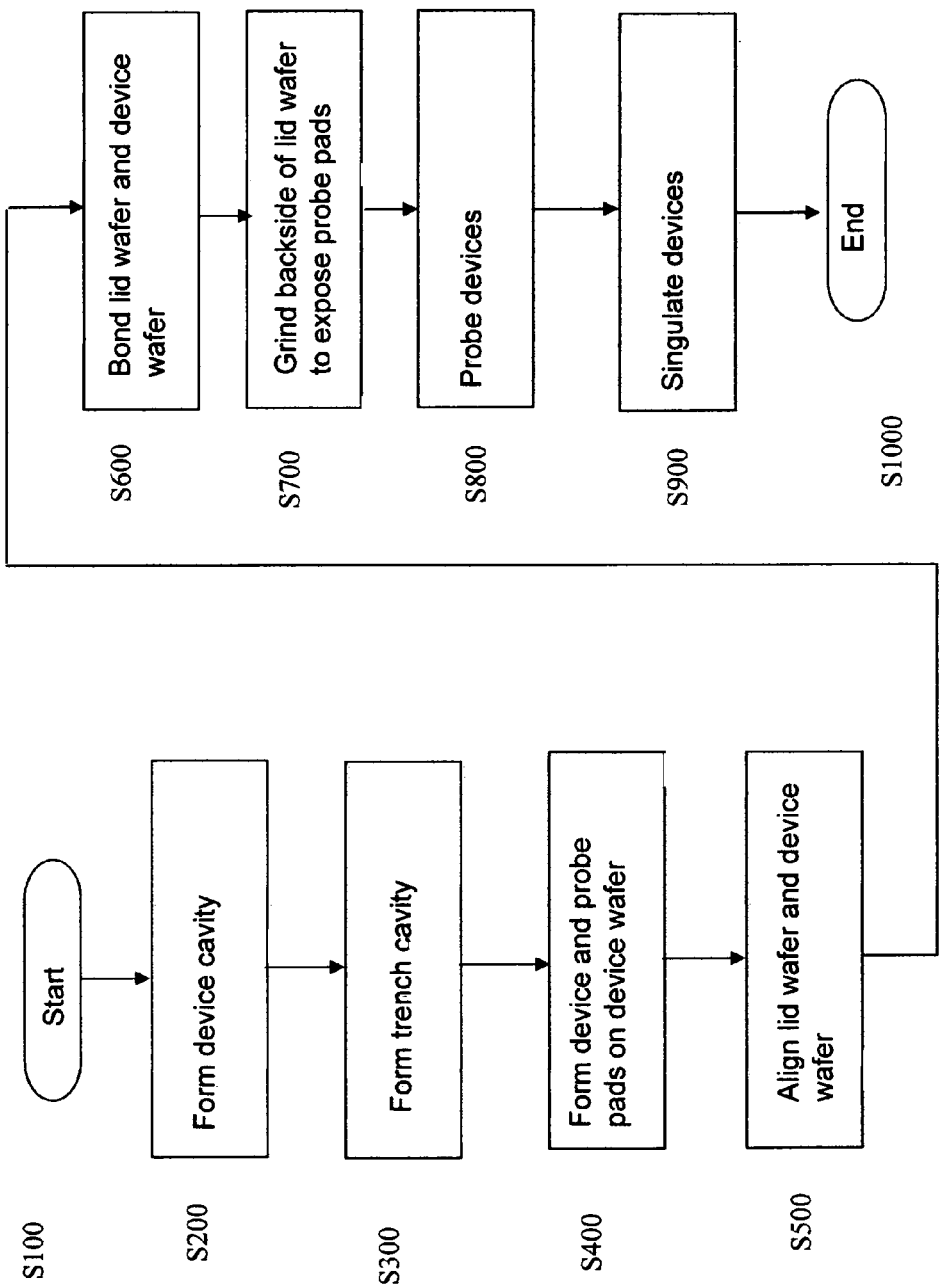
FIG. 6 is a flowchart of an exemplary method for providing access to an encapsulated MEMS device.

FIG. 6 shows an exemplary method for providing access to an encapsulated device. The method begins in step S100 and proceeds to step S200, wherein the trench cavity is formed in the lid wafer. In step S300, the device cavity is formed in the lid wafer. The trench cavity and device cavity may be formed by etching a patterned substrate in a caustic, anisotropic etchant, for example. In step S400, the device and probe pads are formed on the device wafer. The probe pads may be formed by, for example, electroplating a layer of gold about 7 µm thick. The device may be formed by any number of bulk machining or surface machining techniques, for example, sputtering, plating and etching. In step S500, the lid wafer is aligned with the device wafer so that the trench cavity is registered over the probe pads, and the device cavity is registered over the device. In step S600, the lid wafer is bonded to the device wafer, using for example, an epoxy or glass frit bonding material. In step S700, material is removed from the back side of the lid wafer to expose the probe pads. In one exemplary embodiment, material is removed by grinding the back side of the lid wafer. In step S800, the devices are probed to test for functionality. In step S900, the devices are singulated from the device wafer. The process ends in step S11000.

The systems and methods described here may be less expensive and simpler to implement in a manufacturing environment, because only a single process step may be used to create the aperture above the probe pads. The prior art method requires two separate saw cuts to create the aperture, whereas the method described here may require only a single, timed grinding operation, for example. However, the systems and methods disclosed here are primarily advantageous because they eliminate the debris associated with the saw cutting procedure, as well as the alignment challenges associated with that technique.

Although the systems and methods are described with respect to an embodiment that uses grinding as the method to remove material substantially uniformly across the back side of the lid wafer, it should be understood that this is only one embodiment, and that other processes may be used to remove the material substantially uniformly across the back side of the lid wafer. For example, lapping with a slurry on a rotating lapping wheel, ion milling, chemical mechanical polishing (CMP), isotropic wet etching or high rate dry etching across the entire wafer back side are other methods that may be employed to remove the material substantially uniformly.

It should be understood that the method illustrated in FIG. 6 is exemplary only. The steps shown in FIG. 6 need not be performed in the order shown, nor are all of the steps needed to perform the method. For example, the device cavity may be formed before the trench cavity, or this step may be omitted and the device cavity may not be formed at all. In addition, the devices need not be singulated.

While the systems and methods are described with regard to providing access to a set of probe pads, it should also be understood that the systems and methods can be applied to provide access to any features of interest outside an encapsulated area on a device wafer. For example, the systems and methods can be adapted to provide access or an aperture over a step feature formed on the surface of the device wafer. The step feature may then be measured using, for example, an optical profilometer to determine if the step feature meets the required specification. Any features of interest which are ordinarily outside of the encapsulation of the device may be accessed using the system and methods described here.

While various details have been described in conjunction with the exemplary implementations outlined above, various alternatives, modifications, variations, improvements, and/or substantial equivalents, whether known or that are or may be presently unforeseen, may become apparent upon reviewing the foregoing disclosure. For example, while the systems and methods are described with respect to a procedure using a grinding tool to remove material from the back side of the lid wafer, it should be understood that this embodiment is exemplary only, and that the systems and methods disclosed here may be applied to any number of alternative methods for removing material from the back side of the lid wafer. Accordingly, the exemplary implementations set forth above, are intended to be illustrative, not limiting.

What is claimed is:

1. An encapsulated device formed on a device wafer, comprising:
a lid wafer affixed to the device wafer, having an encapsulating lid cavity located in the lid wafer substantially over the device, the encapsulating lid cavity having an inner surface and an exterior outer surface, the exterior outer surface defined by a top surface and sidewalls formed in the lid wafer, wherein the sidewalls extend from the top surface to a bonding surface of the lid wafer, and wherein the sidewalls are substantially non-parallel along substantially an entire length of the sidewalls.

2. The encapsulated device of claim 1, wherein the lid wafer includes a wall of the encapsulation cavity having a thickness in a region substantially over the device of less than about 400 μm.

3. The encapsulated device of claim 1, further comprising: a feature on the device wafer associated with the encapsulated device, but located outside the encapsulating cavity of the lid wafer.

4. The encapsulated device of claim 1, wherein the feature is at least one probe pad electrically coupled to the device.

5. The encapsulated device of claim 1, wherein the lid wafer comprises at least one of silicon, glass, quartz, ceramic, sapphire, and metal, and the encapsulated device comprises an encapsulated MEMS device.

6. The encapsulated device of claim 2, wherein the sidewalls of the lid wafer outside the encapsulation cavity and a line parallel to a surface of the lid wafer define an angle of about 55 degrees.

7. The encapsulated device of claim 2, wherein the entire lengths of the sidewalls of the lid wafer outside the encapsulation cavity are non-parallel, and formed by wet etching the lid wafer.

8. The encapsulated device of claim 4, wherein the probe pad comprises a gold layer about 7 microns thick.

9. The encapsulated device of claim 1, wherein the device wafer is a substantially whole, unsingulated wafer.

10. The encapsulated device of claim 1, where the depth of the encapsulating cavity is about 75 μm.

11. The encapsulated device of claim 1, wherein a thickness of the lid wafer in the region directly over the device is less than about 150 μm.

12. The encapsulated device of claim 1, wherein the substantially non-parallel sidewalls defining the exterior outer surface of the encapsulating cavity are symmetric about an axis substantially through the middle of the device.

13. The encapsulated device of claim 1, wherein a thickness of the sidewalls of the encapsulating cavity are thicker at the top surface than at the bonding surface of the lid wafer.

14. The encapsulated device of claim 3, further comprising at least one aperture in the lid wafer directly over the feature associated with the device.

15. The encapsulated device of claim 14, wherein the aperture has substantially non-parallel sidewalls.

16. The encapsulated device of claim 15, wherein the sidewalls of the aperture form an angle of about 55 degrees with a line parallel to another surface of the lid wafer.

* * * * *